United States Patent

Wang et al.

[11] Patent Number: 6,110,835
[45] Date of Patent: Aug. 29, 2000

[54] METHOD FOR FABRICATING AN ELECTRODE STRUCTURE FOR A CYLINDRICAL CAPACITOR IN INTEGRATED CIRCUIT

[75] Inventors: Chuan-Fu Wang, Taipei Hsien; King-Lung Wu, Tainan Hsien; Cheng-Shuen Hu, Kaohsiung, all of Taiwan

[73] Assignee: United Microelectronics Corp., Hsinchu, Taiwan

[21] Appl. No.: 09/164,620

[22] Filed: Oct. 1, 1998

[30] Foreign Application Priority Data

May 4, 1998 [TW] Taiwan ................... 87106845

[51] Int. Cl.⁷ ............................ H01L 21/3065
[52] U.S. Cl. .............................................. 438/706
[58] Field of Search .................... 438/706, 745, 438/719

[56] References Cited

U.S. PATENT DOCUMENTS 5,858,829  1/1999  Chen ........................ 438/238
5,946,571  8/1999  Hsue et al. ................. 438/255

*Primary Examiner*—Benjamin L. Utech
*Assistant Examiner*—Lynette T. Umez-Eronini
*Attorney, Agent, or Firm*—J. C. Patents; Jiawei Huang

[57] ABSTRACT

A semiconductor fabrication method is provided for fabricating an electrode structure for a cylindrical capacitor in integrated circuit, which can allow the resultant electrode structure to be formed substantially without having horn-like portions such that the leakage current in the capacitor can be minimized. The method includes the following steps of: forming an insulating layer over the substrate; forming a contact window in the insulating layer at a predefined location; forming a first conductive layer over the insulating layer, which fills the entire contact window; forming a mask layer over the first conductive layer; forming a second conductive layer at a predefined location over the mask layer substantially directly above the contact window; forming a sidewall spacer on the sidewall of the second conductive layer; removing the entire second conductive layer; and performing an etching process utilizing the sidewall spacer as mask so as to remove a selected part of the first conductive layer, with the remaining part of the first conductive layer serving as the desired electrode structure.

24 Claims, 5 Drawing Sheets

METHOD FOR FABRICATING AN ELECTRODE STRUCTURE FOR A CYLINDRICAL CAPACITOR IN INTEGRATED CIRCUIT

CROSS-REFERENCE TO RELATED APPLICATION

This application claims the priority benefit of Taiwan application serial no. 87106845, filed May 4, 1998, the full disclosure of which is incorporated herein by reference.

BACKGROUND OF THE INVENTION

1. Field of the Invention

This invention relates to semiconductor fabrication technologies, and more particularly, to a method of fabricating an electrode structure for a cylindrical capacitor in an integrated circuit, which can allow the resultant electrode structure to be formed substantially without having horn-like portions such that the leakage current in the capacitor can be minimized.

2. Description of Related Art

A computer system typically includes a central processing unit and a memory unit. Presently, DRAM (dynamic random access memory) is widely used as the primary memory of computer systems. A DRAM cell is typically composed of a transfer FET (field effect transistor) and a data storage capacitor. Whether a binary value of 1 or 0 is stored in a DRAM cell is dependent on whether the data storage capacitor of the DRAM cell stores electric charge or not.

In conventional DRAMs having a storage capacity less than 1 MB (megabit) of data, it is a customary practice to use a two-dimensional capacitor called a planar-type capacitor as the data storage capacitor. However, one drawback to the planar-type capacitor is that its structure takes up quite a large area on the wafer. The planar-type capacitor is therefore not suitable for DRAM devices that require a high level of integration. In large integration DRAMs such as the 4 MB or higher DRAMs, a three-dimensional capacitor called a stacked-type capacitor is typically used as the data storage capacitor. One example of the stacked-type capacitor is the so-called cylindrical capacitor.

FIGS. 1A–1F are schematic sectional diagrams used to depict the steps involved in a conventional method for fabricating an electrode structure for a cylindrical capacitor.

Referring first to FIG. 1A, the cylindrical capacitor is constructed on a semiconductor substrate 10. In this substrate 10, a plurality of source/drain regions (not shown) is formed, which regions are used to construct a transfer FET that is to be used in conjunction with the cylindrical capacitor to form a DRAM cell.

Subsequently, an insulating layer 12 is formed, preferably from silicon oxide, over the substrate 10 and then a contact window 14 is formed in the insulating layer 12 to expose one source/drain region (not shown) in the substrate 10. After this, a conductive layer 16 is formed, preferably from polysilicon, over the insulating layer 12, which also fills the entire contact window 14 in the insulating layer 12.

Referring next to FIG. 1B, in the subsequent step, a photoresist layer 18 is formed through a photolithographic and etching process at a predefined location on the conductive layer 16 directly above the contact window 14.

Referring further to FIG. 1C, an etching process is then performed on the wafer, with the photoresist layer 18 serving as mask, so as to etch away part of the conductive layer 16 to a predetermined depth. Through this process, the part of the conductive layer 16 that is laid directly beneath the masking photoresist layer 18 forms a protruding portion 20. After this, the entire photoresist layer 18 is removed.

Referring next to FIG. 1D, in the subsequent step, a sidewall spacer 22 is formed on the sidewall of the protruding portion 20 of the conductive layer 16. This sidewall spacer 22 can be formed by, for example, first depositing an insulating layer over the entire top surface of the wafer; and then performing an anisotropic etch-back process on the insulating layer. Through the anisotropic etch-back process, the remaining part of the insulating layer serves as the sidewall spacer 22.

Referring further to FIG. 1E, in the subsequent step, an etching process is performed on the wafer, with the sidewall spacer 22 serving as mask, until all of the conductive layer 16 other than the part lying directly beneath the protruded portion 20 and sidewall spacer 22 is entirely etched away (i.e., until the top surface of the insulating layer 12 is exposed). Through this etching process, however, the part of the conductive layer 16 that is laid directly beneath the sidewall spacer 22 is substantially intact, and moreover a small thickness of the conductive layer 16 still remains over the contact window 14.

Referring further to FIG. 1F, in the subsequent step, the sidewall spacer 22 is removed through, for example, a wet-etching process. The remaining part of the conductive layer, here designated by the reference numeral 16a, serves as a bottom electrode structure that can be later used to form a complete cylindrical capacitor by further forming a dielectric layer (not shown) over the conductive layer 16a and then an upper electrode structure (not shown) over the dielectric layer (not shown).

One drawback to the foregoing electrode structure 16a, however, is that it is formed with horn-like portions 24 that can act as a particle source when the wafer is later submerged in an acid solution during the process for forming the dielectric layer. These horn-like portions 24 can easily cause the resultant cylindrical capacitor to suffer from a large leakage current.

SUMMARY OF THE INVENTION

It is therefore an objective of the present invention to provide a new method for fabricating an electrode structure for a cylindrical capacitor in integrated circuit, which can help allow the resultant electrode structure to be formed substantially without having horn-like portions such that the leakage current in the capacitor can be minimized.

In accordance with the foregoing and other objectives of the present invention, a new method of fabricating an electrode structure for a cylindrical capacitor in integrated circuit is provided.

The method of the invention includes the following steps of: forming an insulating layer over the substrate; forming a contact window in the insulating layer at a predefined location; forming a first conductive layer over the insulating layer, which fills up the entire contact window; forming a mask layer over the first conductive layer; forming a second conductive layer at a predefined location over the mask layer substantially directly above the contact window; forming a sidewall spacer on the sidewall of the second conductive layer; removing the entire second conductive layer; and performing an etching process utilizing the sidewall spacer as mask so as to remove a selected part of the first conductive layer, with the remaining part of the first conductive layer serving as the desired electrode structure.

The foregoing method of the invention allows the bottom electrode structure to be formed substantially without having horn-like portions as seen in the prior art, such that the leakage current in the capacitor can be minimized.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a method for fabricating an electrode structure for a cylindrical capacitor in integrated circuit. The method of the invention is characterized in the forming of a mask layer, preferably from silicon oxide or silicon nitride, that can help allow the resultant electrode structure to be formed with a well controlled thickness without having horn-like portions that would otherwise cause large leakage current in the capacitor.

FIGS. 2A–2G are schematic sectional diagrams used to depict the steps involved in the method according to the invention for fabricating an electrode structure for a cylindrical capacitor.

Figure 2A:
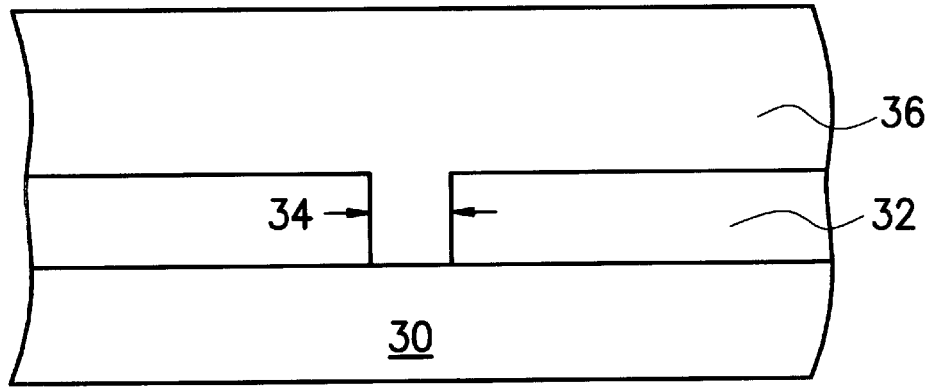
FIGS. 2A–2G are schematic sectional diagrams used to depict the steps involved in the method according to the invention for fabricating an electrode structure for a cylindrical capacitor.

Referring first to FIG. 2A, the cylindrical capacitor is constructed on a semiconductor substrate 30. Note that this substrate 30 is already formed with a plurality of source/drain regions to constitute a transfer FET that is to be used in conjunction with the cylindrical capacitor to form a DRAM cell, but since the fabrication and structure of these source/drain regions are conventional and not within the scope and spirit of the invention, they are not shown in the drawings.

Subsequently, an insulating layer 32 is formed, preferably from silicon oxide, over the substrate 30 and then a contact window 34 is formed in the insulating layer 32 to expose one source/drain region (not shown) in the substrate 30. After this, a first conductive layer 36 is formed, preferably from polysilicon, through a CVD (chemical-vapor deposition) process, over the insulating layer 32 to a thickness of about 8,000 Å. Through this process, the first conductive layer 36 also fills the entire contact window 34 in the insulating layer 32.

Figure 2B:
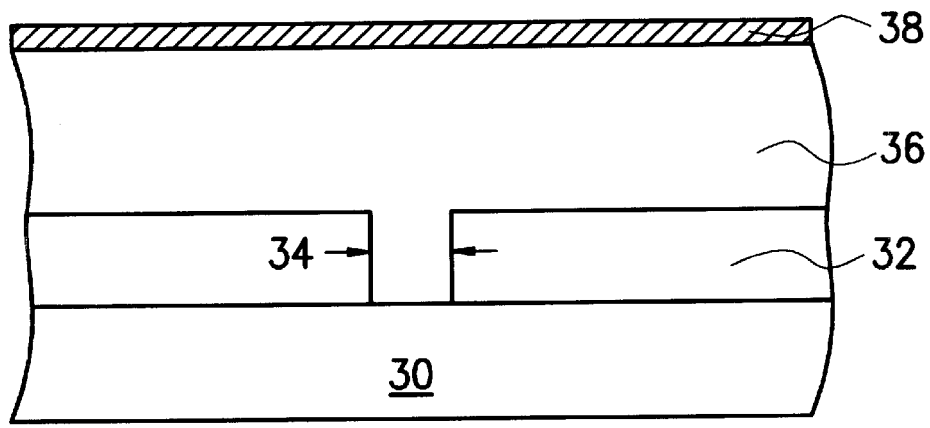

Referring next to FIG. 2B, in the subsequent step, a mask layer 38, such a layer of silicon oxide or a layer of silicon nitride, is formed through a CVD process over the first conductive layer 36, preferably to a thickness of about 200 Å.

Figure 2C:
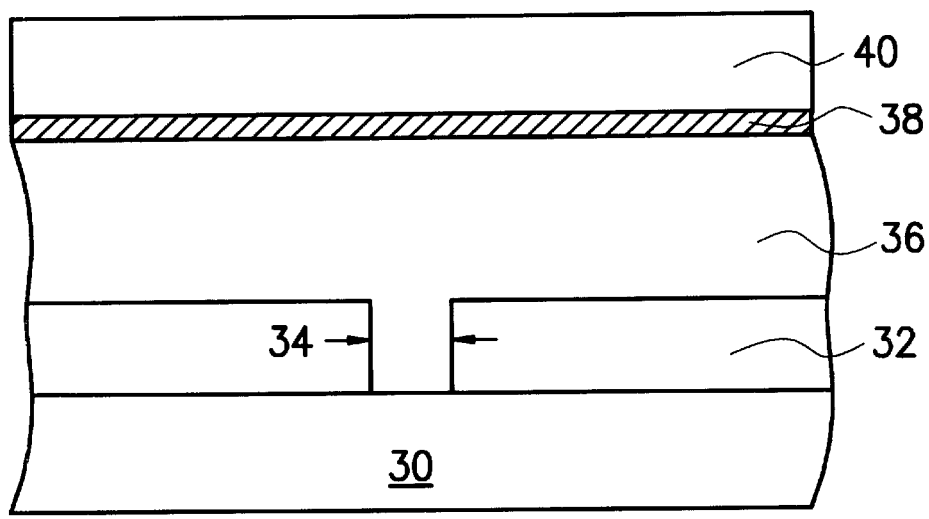

Referring further to FIG. 2C, in the subsequent step, a second conductive layer 40 is formed over the mask layer 38, preferably from polysilicon through a CVD process to a thickness of from 2,500 Å to 3,000 Å.

Figure 2D:
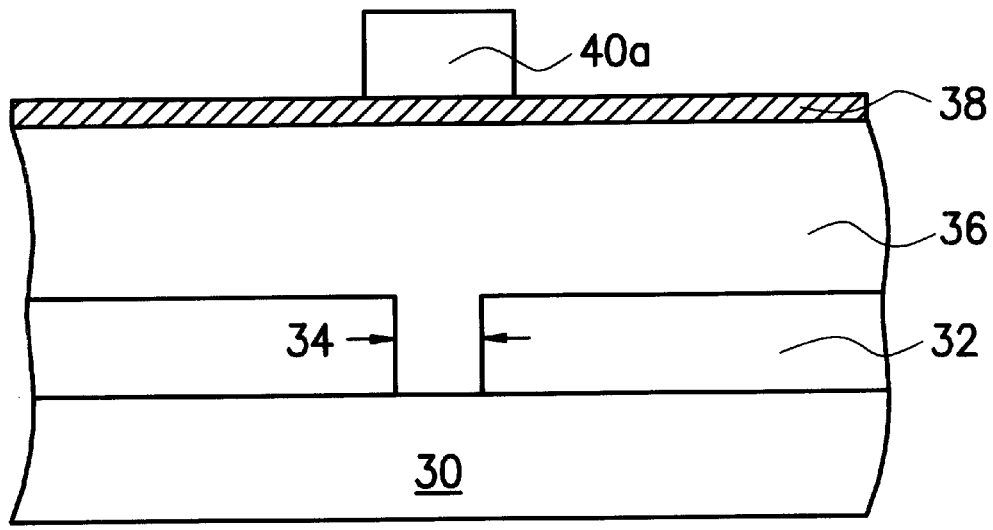

Referring next to FIG. 2D, the second conductive layer 40 is then selectively removed through a photolithographic and etching process in such a manner that allows the remaining part of the second conductive layer (here designated by the reference numeral 40a for distinguishing purpose) to be located directly above the contact window 34.

Figure 2E:
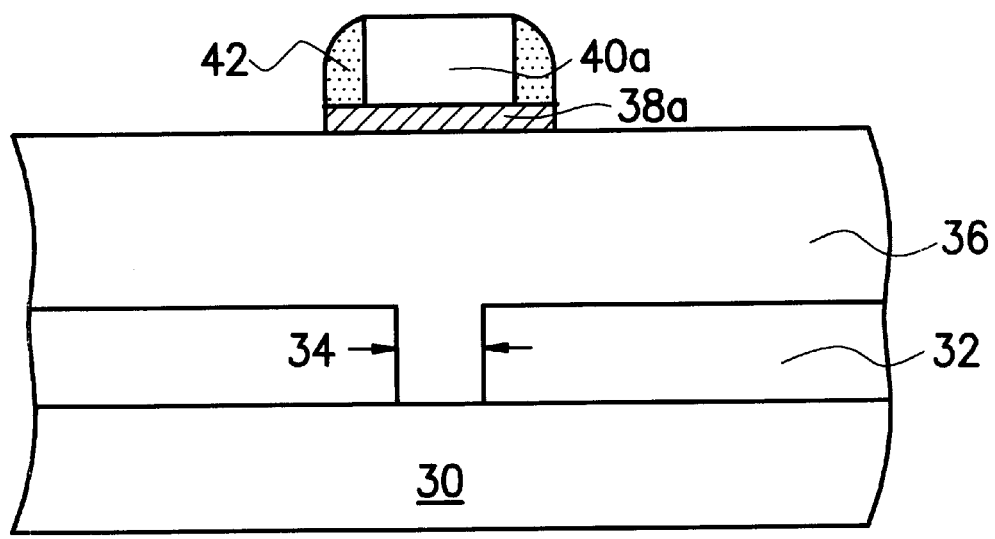

Referring further to FIG. 2E, in the subsequent step, a sidewall spacer 42 is formed on the sidewall of the second conductive layer 40a. This sidewall spacer 42 can be formed by, for example, first depositing an insulating layer, such as a layer of silicon oxide or a layer of silicon nitride, over the entire top surface of the wafer and then performing an anisotropic etch-back process on the insulating layer. Through the anisotropic etch-back process, the remaining part of the insulating layer serves as the sidewall spacer 42. It is to be noted that the mask layer 38 and the sidewall spacer 42 can be either formed from the same material or from two different materials.

In the case of the mask layer 38 and the sidewall spacer 42 being formed from the same material, the anisotropic etch-back process to form the sidewall spacer 42 also causes the part of the mask layer 38 that is uncovered by the second conductive layer 40a to be etched away. Therefore, through the anisotropic etch-back process, only the part that is laid directly beneath the second conductive layer 40a and the sidewall spacer 42 is left intact (this remaining part of the mask layer is here designated by the reference numeral 38a for distinguishing purpose).

In the case of the mask layer 38 and the sidewall spacer 42 being formed from two different materials, the entire mask layer 38 remains intact (not shown) through the etching process. In both cases, the final, resultant electrode structures are substantially the same. Therefore, both cases are usable.

Figure 2F:
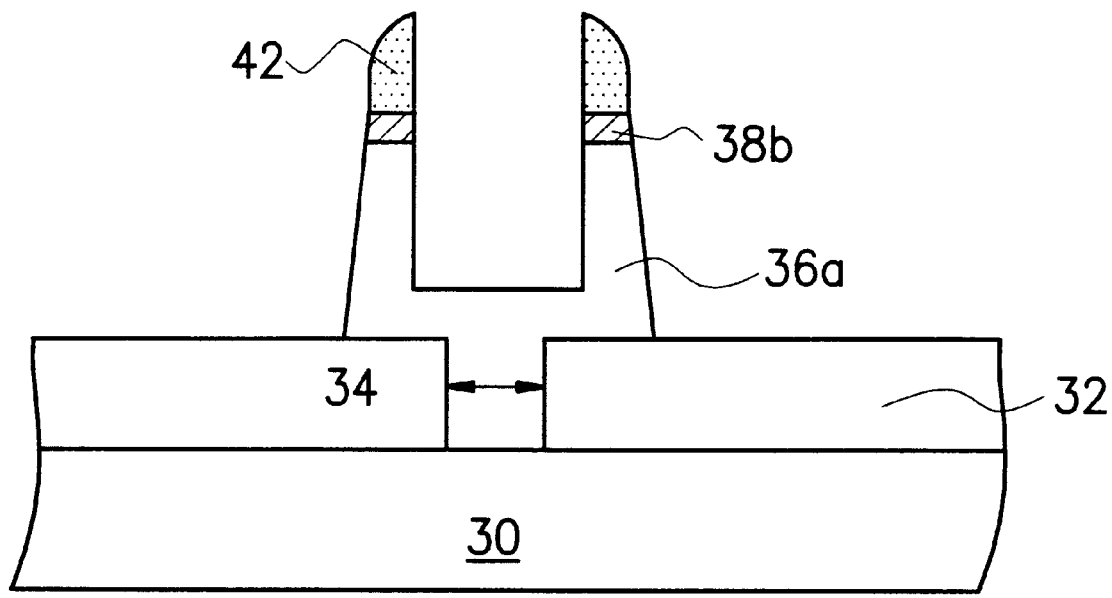

Referring next to FIG. 2F, in the subsequent step, an etching process, such as an anisotropic dry-etching process, is performed on the wafer, with the sidewall spacer 42 serving as mask, so as to etch away the second conductive layer, a part of the mask layer, and a part of the first conductive layer 36 to a controlled depth until a part of the insulating layer 32 not covered by the mask layer 38a is exposed. Through this process, all the part of the mask layer 38a that is uncovered by the sidewall spacer 42 is etched away (the remaining part thereof is here designated by the reference numeral 38b for distinguishing purpose). Further, all the part of the first conductive layer 36 other than the portion lying underneath the sidewall spacer 42 is substantially entirely removed, and the part covered by the mask layer 38a but not covered by the sidewall spacer 42 is partly removed to a predetermined depth (the remaining part of the first conductive layer is here designated by the reference numeral 36a). As shown, the remaining first conductive layer 36a includes the part lying directly beneath the sidewall spacer 42, the part of a predetermined thickness over the contact window 34, and the part that fills in the contact window 34.

Figure 1A:
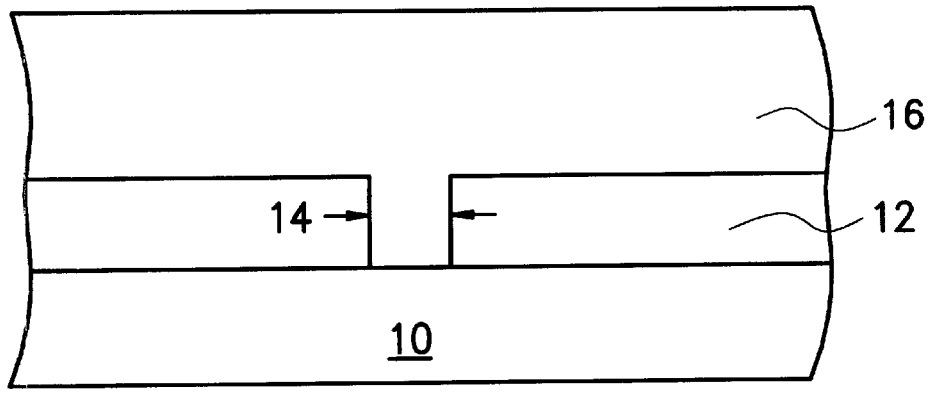
FIGS. 1A–1F are schematic sectional diagrams used to depict the steps involved in a conventional method for fabricating an electrode structure for a cylindrical capacitor.
Figure 1B:
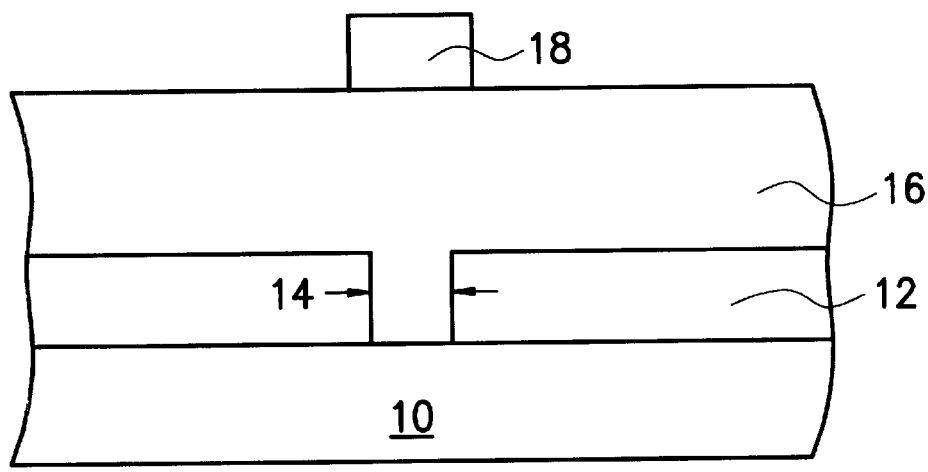
Figure 1C:
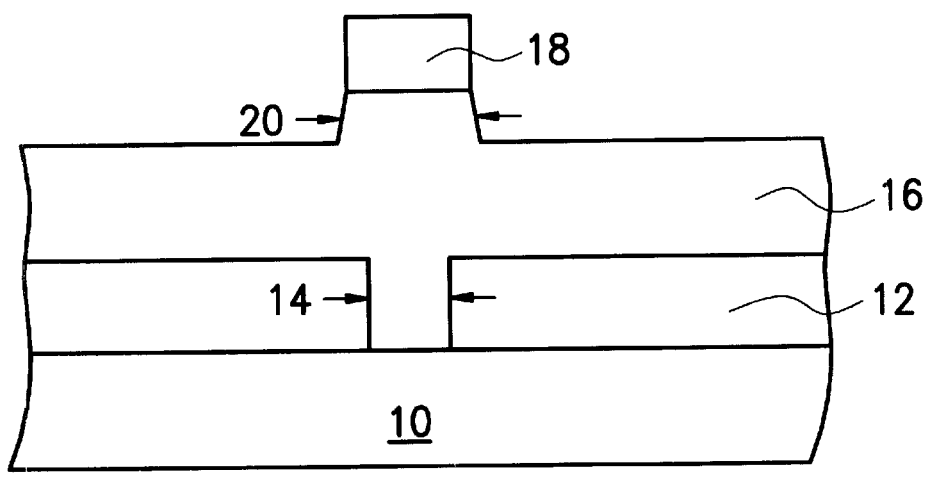
Figure 1D:
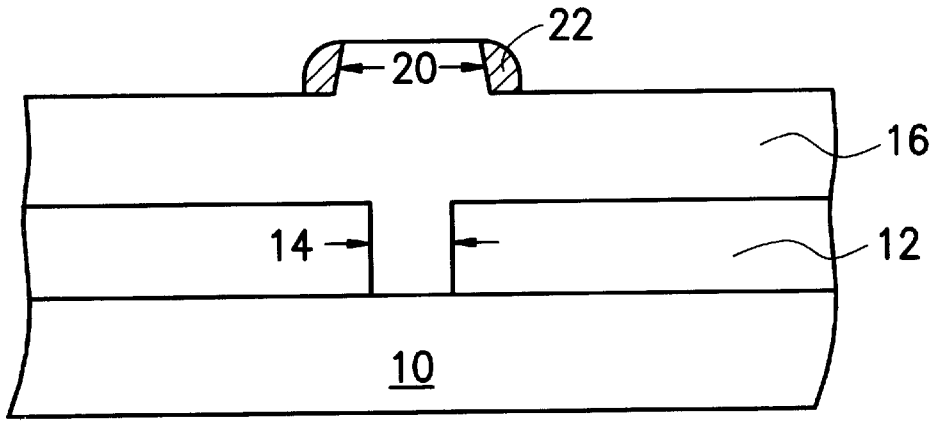
Figure 1E:
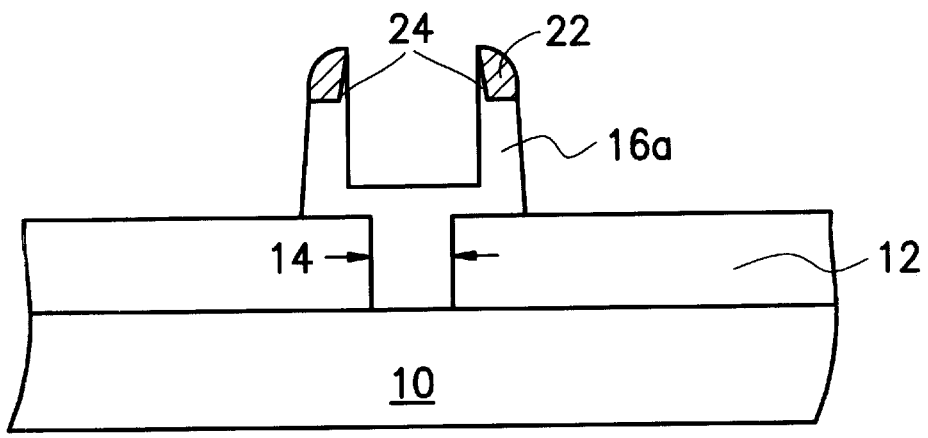
Figure 1F:
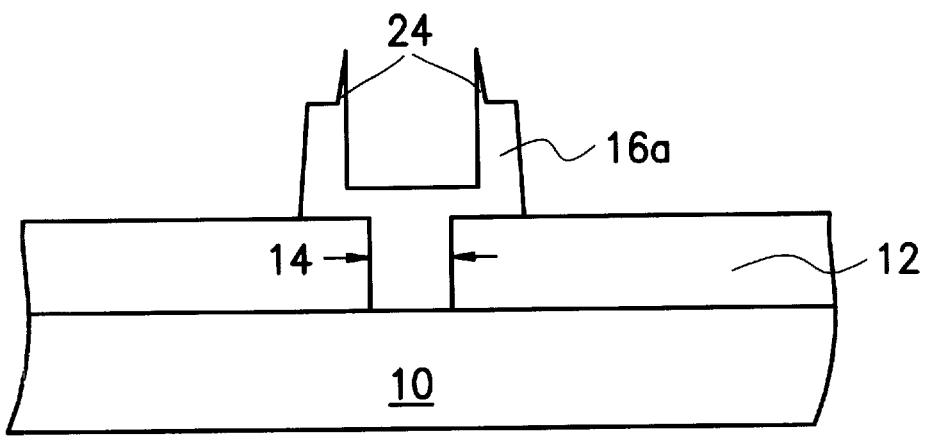
Figure 2G:
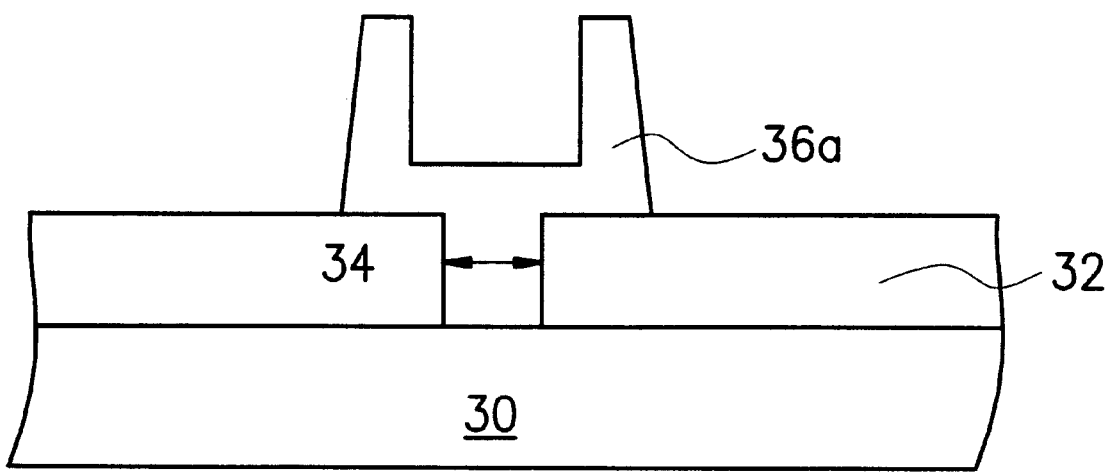

Referring finally to FIG. 2G, in the subsequent step, the sidewall spacer 42 and the remaining mask layer 38b are entirely removed through, for example, either a wet-etching process or a CMP (chemical-mechanical polish) process. Through this removal process, however, the first conductive layer 36a is substantially left intact. As illustrated, this first conductive layer 36a is formed substantially without having horn-like portions as seen in the prior art of FIG. 1F.

The first conductive layer 36a serves as a bottom electrode structure that can be later used to form a complete cylindrical capacitor by further forming a dielectric layer (not shown) over the first conductive layer 36a and then an upper electrode structure (not shown) over the dielectric layer (not shown).

In conclusion, the method of the invention has the following advantages over the prior art.

(1) First, by the method of the invention, the first conductive layer 36 and the second conductive layer 40 can be easily deposited to the predetermined thicknesses without having to perform etching to a controlled depth.

(2) Second, the method of the invention can be carried out under a wider temperature range of from 50° C. to 75° C.

(3) Third, the method of the invention allows the bottom electrode structure to be formed substantially without having horn-like portions as seen in the prior art, such that the leakage current in the capacitor can be minimized.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an electrode structure for a cylindrical capacitor constructed on a semiconductor substrate, comprising the steps of:

(1) forming an insulating layer over the substrate;

(2) forming a contact window in the insulating layer at a location;

(3) forming a first conductive layer over the insulating layer, which first conductive layer fills the entire contact window;

(4) forming a mask layer on and adjacent to the first conductive layer;

(5) forming a second conductive layer at a location over the mask layer substantially directly above the contact window, wherein the second conductive layer is isolated from the first conductive layer by the mask layer;

(6) forming a sidewall spacer on the sidewall of the second conductive layer;

(7) performing an etching process with the sidewall spacer serving as mask so as to remove the second conductive layer, a part of the mask layer, and a part of the first conductive layer, with the remaining part of the first conductive layer forms the electrode structure.

2. The method of claim 1, further comprising, following the step (7), the step of:

removing both the sidewall spacer and the mask layer entirely.

3. The method of claim 1, wherein the first conductive layer is formed from polysilicon.

4. The method of claim 1, wherein the mask layer is formed from silicon oxide.

5. The method of claim 1, wherein the mask layer is formed from silicon nitride.

6. The method of claim 1, wherein the mask layer is formed to a thickness of 200 Å.

7. The method of claim 1, wherein the mask layer is formed through a CVD process.

8. The method of claim 1, wherein the second conductive layer is formed from polysilicon.

9. The method of claim 1, wherein the sidewall spacer is formed from silicon oxide.

10. The method of claim 1, wherein the sidewall spacer is formed from silicon nitride.

11. The method of claim 1, wherein the mask layer is formed from the same material that is used to form the sidewall spacer.

12. The method of claim 1, wherein the forming of the sidewall spacer includes the steps of:

depositing an insulating layer over the mask layer; and performing an anisotropic etch-back process on the insulating layer, with the remaining part of the insulating layer serving as the sidewall spacer.

13. The method of claim 1, wherein in the step (7), the etching process is an anisotropic dry-etching process.

14. A method for fabricating an electrode structure for a cylindrical capacitor constructed on a semiconductor substrate, comprising the steps of:

(1) forming an insulating layer over the substrate;

(2) forming a contact window in the insulating layer at a location;

(3) forming a first conductive layer over the insulating layer, which first conductive layer fills the entire contact window;

(4) forming a mask layer from a selected material directly on the first conductive layer;

(5) forming a second conductive layer at a location over the mask layer substantially directly above the contact window, wherein the second conductive layer and the first conductive layer are separated by the mask layer;

(6) forming a sidewall spacer on the sidewall of the second conductive layer, the sidewall spacer being formed from the same material used to form the mask layer;

(7) performing an etching process utilizing the sidewall spacer as mask so as to remove the second conductive layer, a part of the mask layer, and a part of the first conductive layer to a depth, with the remaining part of the first conductive layer forms the electrode structure; and (8) removing both the sidewall spacer and the mask layer entirely.

15. The method of claim 14, wherein the first conductive layer is formed from polysilicon.

16. The method of claim 14, wherein the mask layer is formed from silicon oxide.

17. The method of claim 14, wherein the mask layer is formed from silicon nitride.

18. The method of claim 14, wherein the mask layer is formed to a thickness of 200 Å.

19. The method of claim 14, wherein the mask layer is formed through a CVD process.

20. The method of claim 14, wherein the second conductive layer is formed from polysilicon.

21. The method of claim 14, wherein the sidewall spacer is formed from silicon oxide.

22. The method of claim 14, wherein the sidewall spacer is formed from silicon nitride.

23. The method of claim 14, wherein the forming of the sidewall spacer includes the steps of:

depositing an insulating layer over the mask layer; and performing an anisotropic etch-back process on the insulating layer with the remaining part of the insulating layer serving as the sidewall spacer.

24. The method of claim 14, wherein in the step (8), the etching process is an anisotropic dry-etching process.

* * * * *